US011798511B2

(12) United States Patent
Lv (10) Patent No.: US 11,798,511 B2
(45) Date of Patent: Oct. 24, 2023

(54) GOA CIRCUIT AND DRIVING METHOD THEREFOR, AND DISPLAY PANEL (71) Applicant: WUHAN CHINA STAR OPTOELECTRONICS TECHNOLOGY CO., LTD., Wuhan (CN)

(72) Inventor: Jing Lv, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 189 days.

(21) Appl. No.: 17/280,909

(22) PCT Filed: Nov. 26, 2020

(86) PCT No.: PCT/CN2020/131755
§ 371 (c)(1),
(2) Date: Mar. 28, 2021

(87) PCT Pub. No.: WO2022/095159
PCT Pub. Date: May 12, 2022

(65) Prior Publication Data
US 2022/0358891 A1 Nov. 10, 2022

(30) Foreign Application Priority Data
Nov. 3, 2020 (CN) .......................... 202011211809.0

(51) Int. Cl.
*G09G 3/36* (2006.01)
*G06F 3/041* (2006.01)
(52) U.S. Cl.
CPC ....... *G09G 3/3677* (2013.01); *G06F 3/04166* (2019.05); *G09G 3/3696* (2013.01);
(Continued)

(58) Field of Classification Search
CPC ......... G09G 3/3677; G09G 2310/0286; G09G 3/3266; G09G 2310/0283;
(Continued)

(56) References Cited

U.S. PATENT DOCUMENTS 9,626,928 B2 * 4/2017 Xiao .................... G09G 3/3677
9,841,620 B2 * 12/2017 Li ............................ G09G 3/36
(Continued)

FOREIGN PATENT DOCUMENTS

CN     103258494 A     8/2013
CN     104992661 A     10/2015
(Continued)

OTHER PUBLICATIONS

International Search Report in International application No. PCT/CN2020/131755, dated Jul. 27, 2021.
(Continued)

*Primary Examiner* — Dismery Mercedes
(74) *Attorney, Agent, or Firm* — PV IP PC; Wei Te Chung; Zhigang Ma (57) ABSTRACT

The invention provides a GOA circuit and driving method therefor, and a display panel. The GOA circuit includes a GOA unit. The GOA unit includes a forward and reverse scan control module, a node signal control module, a voltage regulator module, an output control module, a first pull-down module, and a second pull-down module. When the second pull-down module is in operation, the forward and reverse scan control module controls the voltage regulator module to be in an off state, so that the GOA circuit has no transistor in the on state for a long time, thus to suppress threshold voltage drift in transistors.

8 Claims, 3 Drawing Sheets

(52) U.S. Cl.
CPC ... *G06F 3/0412* (2013.01); *G09G 2300/0842* (2013.01); *G09G 2310/0283* (2013.01); *G09G 2310/0286* (2013.01); *G09G 2310/0289* (2013.01); *G09G 2310/061* (2013.01)

(58) Field of Classification Search
CPC .............. G09G 2310/061; G09G 3/20; G09G 2300/0842; G09G 2310/0267; G09G 2310/0202; G09G 3/3688; G09G 2310/0289; G09G 3/3648; G09G 3/3696; G09G 3/326; G06F 3/04166; G06F 3/0412; G06F 3/04184; G11C 19/28
See application file for complete search history.

(56) References Cited

U.S. PATENT DOCUMENTS

| | | | | |
|---|---|---|---|---|
| 10,043,477 | B2* | 8/2018 | Li | G09G 3/3696 |
| 10,741,139 | B2* | 8/2020 | Hong | G11C 19/28 |
| 11,081,042 | B2* | 8/2021 | Gu | G11C 19/28 |
| 11,127,363 | B2* | 9/2021 | Zhang | G09G 3/20 |
| 2017/0018245 | A1 | 1/2017 | Park | |
| 2018/0068628 | A1* | 3/2018 | Xiao | G09G 3/3648 |
| 2019/0130858 | A1* | 5/2019 | Xiao | G09G 3/3677 |
| 2019/0130859 | A1* | 5/2019 | Dai | G09G 3/3677 |
| 2019/0163001 | A1* | 5/2019 | Gong | G09G 3/36 |
| 2019/0385556 | A1* | 12/2019 | Guan | G11C 19/28 |
| 2020/0082746 | A1* | 3/2020 | Zhang | G09G 3/3677 |
| 2020/0160805 | A1* | 5/2020 | Hong | G09G 3/20 |
| 2020/0410948 | A1* | 12/2020 | Dai | G09G 3/3677 |

FOREIGN PATENT DOCUMENTS

| | | |
|---|---|---|
| CN | 106098003 A | 11/2016 |
| CN | 106782389 A | 5/2017 |
| CN | 107221279 A | 9/2017 |
| CN | 107749281 A | 3/2018 |
| CN | 108389554 A | 8/2018 |
| CN | 108399899 A | 8/2018 |
| CN | 108538268 A | 9/2018 |
| CN | 108962168 A | 12/2018 |
| CN | 109036304 A | 12/2018 |
| CN | 110782855 A | 2/2020 |
| CN | 110875002 A | 3/2020 |
| CN | 111681624 A | 9/2020 |

OTHER PUBLICATIONS

Written Opinion of the International Search Authority in International application No. PCT/CN2020/131755, dated Jul. 27, 2021.
Chinese Office Action issued in corresponding Chinese Patent Application No. 202011211809.0 dated Sep. 29, 2021, pp. 1-6.

* cited by examiner

FIG. 1

(Related Art)

FIG. 2

FIG. 3

GOA CIRCUIT AND DRIVING METHOD THEREFOR, AND DISPLAY PANEL

CROSS REFERENCE TO RELATED APPLICATIONS

The disclosure claims priority to International Application No. PCT/CN2020/131755, filed on Nov. 26, 2020, titled "GOA CIRCUIT AND DRIVING METHOD THEREFOR, AND DISPLAY PANEL" which claims priority to Chinese patent application No. 202011211809.0, titled "GOA CIRCUIT AND DRIVING METHOD THEREFOR, AND DISPLAY PANEL", filed with the National Intellectual Property Administration on Nov. 3, 2020, which is incorporated by reference in the present application in its entirety.

BACKGROUND OF INVENTION

Field of Invention

The present invention relates to the field of display technology, and in particular to a GOA circuit and driving method therefor, and a display panel.

Description of Prior Art

Gate driver on array (GOA) circuit is a technology that uses current thin-film transistor (TFT) liquid crystal display (LCD) array process to form a gate line scan driving signal circuit on an array substrate and realize a driving scheme that drives gate line scan.

Figure 1:
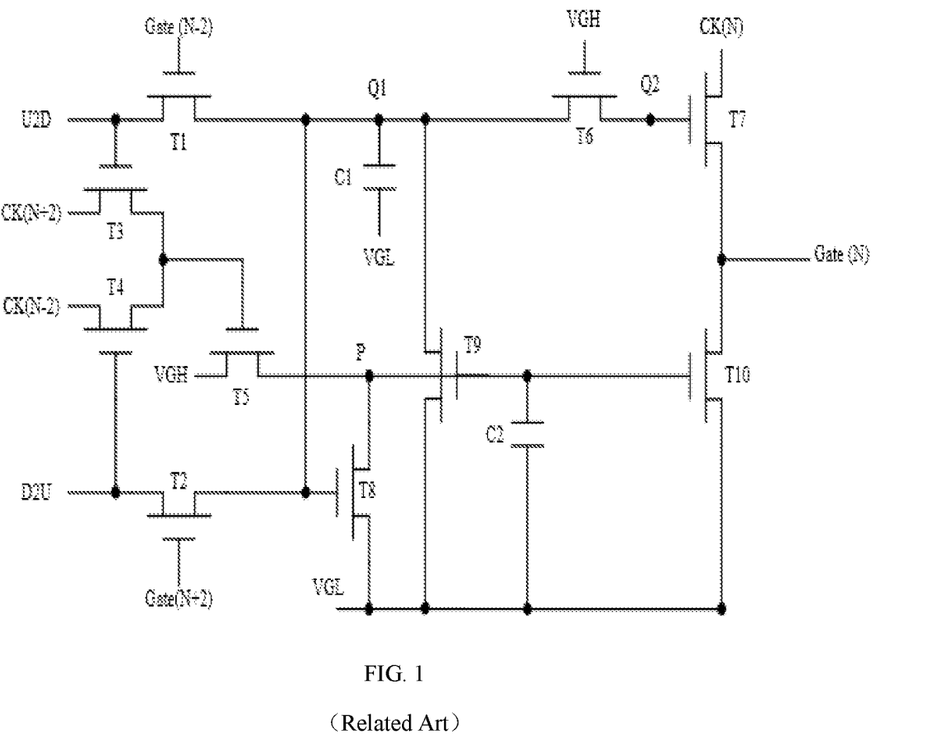
FIG. 1 is a schematic diagram showing a structural view of a current GOA circuit.

A GOA circuit contains a plurality of transistors. If a transistor is kept on for a long period of time, a threshold voltage of the transistor is prone to drift, causing the transistor to malfunction, the GOA circuit output to fail, and display to work abnormally. In an example of forward scan, in a GOA circuit unit as shown in FIG. 1, a gate of transistor T6 is connected to a high voltage signal, and a threshold voltage of transistor T6 may drift if the transistor is kept on for a long time. The threshold voltage drift may be hastened by a high temperature environment, such as a vehicle display, and thin film transistors (TFTs) of the transistor T6 may be abnormal, resulting in failure of GOA circuit output and abnormal display.

Hence, a GOA circuit and a driving method therefor and a display panel to solve the technical problems are desired.

SUMMARY OF INVENTION

Technical Problems

The invention provides a GOA circuit and a driving method therefor and a display panel to solve the technical problems where a GOA circuit contains a plurality of transistors, and a threshold voltage of the transistor is prone to drift during a long time of transistor on state, that causes the transistor to malfunction, the GOA circuit output to fail, and display to work abnormally.

Technical Solutions

To solve the problems, the invention provides the following technical solutions:

An embodiment of the invention provides a GOA circuit comprising M cascaded GOA units, wherein N is a positive integer greater than two, M is a positive integer greater than or equal to N+2, an Nth stage GOA unit comprises:

a forward and reverse scan control module configured to control the GOA circuit for forward scan according to a forward scan control signal or reverse scan according to a reverse scan control signal;

a node signal control module connected to the forward and reverse scan control module, configured to control the GOA circuit to output a low voltage level gate driving signal during a non-operating state according to a (N+2)th stage N+2nd stage clock signal and a (N−2)th stage clock signal;

a voltage regulator module connected to the forward and reverse scan control module via a first node, configured to maintain a voltage level of the first node under control of the forward and reverse scan control module;

an output control module connected to the voltage regulator module through a second node, configured to control output of a gate driving signal of an instant stage according to a clock signal of the instant stage;

a first pull-down module connected to the node signal control module via a third node, configured to pull down a voltage level of the gate driving signal of the instant stage under control of the node signal control module; and a second pull-down module connected to the output control module and the voltage regulator module through the second node, configured to pull down a voltage level of the second node, with the forward and reverse scan control module controlling the voltage regulator module in an off state when the second pull-down module is in an operating state under control of the node signal control module.

According to the GOA circuit provided by an embodiment of the invention, the forward and reverse scan control module comprises a first transistor and a second transistor, a first electrode of the first transistor is connected to the forward scan control signal, a gate of the first transistor is connected to a (N−2)th stage gate driving signal, a first electrode of the second transistor is connected to the reverse scan control signal, a gate of the second transistor is connected to a (N+2)th stage N+2nd stage gate driving signal, and a second electrode of the second transistor is connected to a second electrode of the first transistor.

According to the GOA circuit provided by an embodiment of the invention, a node signal control module comprises a third transistor, a fourth transistor, and a fifth transistor, a first electrode of the third transistor is connected to a level N+2 clock signal, a gate of the third transistor is connected to the first electrode of the first transistor, a first electrode of the fourth transistor is connected to a level N−2 clock signal, a gate of the fourth transistor is connected to the first electrode of the second transistor, a first electrode of the fifth transistor is connected to a high voltage level signal, a second electrode of the fifth transistor is connected to the first pull-down module through the third node, and a gate of the fifth transistor is connected to a second electrode of the third transistor and to a second electrode of the fourth transistor.

According to the GOA circuit provided by an embodiment of the invention, the voltage regulator module comprises a sixth transistor and a first storage capacitor, a gate of the sixth transistor is connected to the second electrode of the first transistor and to a first pole plate of the first storage capacitor through the first node, the first electrode of the sixth transistor is connected to the high voltage level signal, and the second pole plate of the first storage capacitor is connected to a low voltage level signal.

According to the GOA circuit provided by an embodiment of the invention, the output control module comprises a seventh transistor, a first electrode of the seventh transistor is connected to the clock signal of the instant stage, a second electrode of the seventh transistor is connected to the gate driving signal of the instant stage, a gate of the seventh transistor is connected to a second electrode of the sixth transistor through the second node.

According to the GOA circuit provided by an embodiment of the invention, the first pull-down module comprises an eighth transistor, a ninth transistor, a tenth transistor, and a second storage capacitor, wherein a first electrode of the eighth transistor is connected to the low voltage level signal, and a gate of the eighth transistor is connected to the second electrode of the second transistor, a first electrode of the ninth transistor is connected to the low voltage level signal, and a second electrode of the ninth transistor is connected via the first node to the gate of the sixth transistor and to the first pole plate of the first storage capacitor, a first electrode of the tenth transistor is connected to the low voltage level signal, a gate of the tenth transistor is connected via the third node to the second electrode of the fifth transistor, a second electrode of the tenth transistor is connected to the gate driving signal of the instant stage, and a second electrode of the second storage capacitor is connected to the low voltage level signal.

According to the GOA circuit provided by an embodiment of the invention, the second pull-down module comprises an eleventh transistor, a gate of the eleventh transistor is connected via the third node to the second electrode of the fifth transistor, to a gate of the ninth transistor, and to a first pole plate of the second storage capacitor, a first electrode of the eleventh transistor is connected to the low voltage level signal, a second electrode of the eleventh transistor is connected via the second node to the second electrode of the sixth transistor and to the gate of the seventh transistor.

According to the GOA circuit provided by an embodiment of the invention, the GOA circuit further comprises a reset module, the reset module comprises a twelfth transistor, a gate of the twelfth transistor and the first electrode of the twelfth transistor are interconnected and both connected to a reset signal, a second electrode of the twelfth transistor is connected to the gate of the tenth transistor via the third node.

According to the GOA circuit provided by an embodiment of the invention, the plurality of transistors in the GOA circuit are low temperature polycrystalline silicon thin film transistors.

An embodiment of the invention provides a display panel comprising a GOA circuit having M cascaded GOA units, wherein N is a positive integer greater than two, M is a positive integer greater than or equal to N+2, an Nth stage GOA unit comprises:

a forward and reverse scan control module configured to control the GOA circuit for forward scan according to a forward scan control signal or reverse scan according to a reverse scan control signal;

a node signal control module connected to the forward and reverse scan control module, configured to control the GOA circuit to output a low voltage level gate driving signal during a non-operating state according to a (N+2)th stage clock signal and a (N−2)th stage clock signal;

a voltage regulator module connected to the forward and reverse scan control module via a first node, configured to maintain a voltage level of the first node under control of the forward and reverse scan control module;

an output control module connected to the voltage regulator module through a second node, configured to control output of a gate driving signal of an instant stage according to a clock signal of the instant stage;

a first pull-down module connected to the node signal control module via a third node, configured to pull down a voltage level of the gate driving signal of the instant stage under control of the node signal control module; and a second pull-down module connected to the output control module and the voltage regulator module through the second node, configured to pull down a voltage level of the second node, with the forward and reverse scan control module controlling the voltage regulator module in an off state when the second pull-down module is in an operating state under control of the node signal control module.

According to the display panel provided by an embodiment of the invention, the forward and reverse scan control module comprises a first transistor and a second transistor, a first electrode of the first transistor is connected to the forward scan control signal, a gate of the first transistor is connected to a (N−2)th stage gate driving signal, a first electrode of the second transistor is connected to the reverse scan control signal, a gate of the second transistor is connected to a (N+2)th stage gate driving signal, and a second electrode of the second transistor is connected to a second electrode of the first transistor.

According to the display panel provided by an embodiment of the invention, the node signal control module comprises a third transistor, a fourth transistor, and a fifth transistor, a first electrode of the third transistor is connected to a level N+2 clock signal, a gate of the third transistor is connected to the first electrode of the first transistor, a first electrode of the fourth transistor is connected to a level N−2 clock signal, a gate of the fourth transistor is connected to the first electrode of the second transistor, a first electrode of the fifth transistor is connected to a high voltage level signal, a second electrode of the fifth transistor is connected to the first pull-down module through the third node, and a gate of the fifth transistor is connected to a second electrode of the third transistor and to a second electrode of the fourth transistor.

According to the display panel provided by an embodiment of the invention, the voltage regulator module comprises a sixth transistor and a first storage capacitor, a gate of the sixth transistor is connected to the second electrode of the first transistor and to a first pole plate of the first storage capacitor through the first node, the first electrode of the sixth transistor is connected to the high voltage level signal, and the second pole plate of the first storage capacitor is connected to a low voltage level signal.

According to the display panel provided by an embodiment of the invention, the output control module comprises a seventh transistor, a first electrode of the seventh transistor is connected to the clock signal of the instant stage, a second electrode of the seventh transistor is connected to the gate driving signal of the instant stage, a gate of the seventh transistor is connected to a second electrode of the sixth transistor through the second node.

According to the display panel provided by an embodiment of the invention, the first pull-down module comprises an eighth transistor, a ninth transistor, a tenth transistor, and a second storage capacitor, wherein a first electrode of the eighth transistor is connected to the low voltage level signal, and a gate of the eighth transistor is connected to the second electrode of the second transistor, a first electrode of the ninth transistor is connected to the low voltage level signal, and a second electrode of the ninth transistor is connected via the first node to the gate of the sixth transistor and to the first pole plate of the first storage capacitor, a first electrode of the tenth transistor is connected to the low voltage level signal, a gate of the tenth transistor is connected via the third node to the second electrode of the fifth transistor, a second electrode of the tenth transistor is connected to the gate driving signal of the instant stage, and a second electrode of the second storage capacitor is connected to the low voltage level signal.

According to the display panel provided by an embodiment of the invention, the second pull-down module comprises an eleventh transistor, a gate of the eleventh transistor is connected via the third node to the second electrode of the fifth transistor, to a gate of the ninth transistor, and to a first pole plate of the second storage capacitor, a first electrode of the eleventh transistor is connected to the low voltage level signal, a second electrode of the eleventh transistor is connected via the second node to the second electrode of the sixth transistor and to the gate of the seventh transistor.

According to the display panel provided by an embodiment of the invention, the GOA circuit further comprises a reset module, the reset module comprises a twelfth transistor, a gate of the twelfth transistor and the first electrode of the twelfth transistor are interconnected and both connected to a reset signal, a second electrode of the twelfth transistor is connected to the gate of the tenth transistor via the third node.

According to the display panel provided by an embodiment of the invention, the plurality of transistors in the GOA circuit are low temperature polycrystalline silicon thin film transistors.

An embodiment of the invention provides a method for driving a GOA circuit comprising the steps of:

in an input phase, a forward scan control signal being connected to the forward and reverse scan control module in the GOA circuit and operating a voltage regulator module and an output control module, a node signal control module keeping a first pull-down module and a second pull-down module in an off state, and the output control module outputting gate driving signal of an instant stage;

in an output phase, a clock signal of the instant stage causing a bootstrap effect in the output control module, the output control module being fed with the gate driving signal of the instant stage to drive driver transistors in a pixel driving circuit;

in a first pull-down phase, the output control module being fed with the gate driving signal of the instant stage; and in a second pull-down phase, the first pull-down module and the second pull-down module being in operation, and pulling down a voltage level of the gate driving signal of the instant stage, the forward and reverse scan control module controlling the voltage regulator module in an off state, the output control module being in an off state, and an output terminal of the output control module being fed with a low voltage level signal.

The method for driving the GOA circuit provided by an embodiment of the invention further comprises in a reset phase that precedes the input phase, the first pull-down module and the second pull-down module being in an operating state, and the output terminal of the output control module being fed with the low voltage level signal.

Useful Effects

The beneficial effect of the present invention is that the GOA circuit and the driving method therefor and display panel provided by the present invention improves reliability of the GOA circuit by adding a second pull-down module. The second pull-down module is connected to the output control module and the voltage regulator module through the second node that pulls down a voltage level of the second node. Under control of the node signal control module, when the second pull-down module is in an operating state, the forward and reverse scan control module controls the voltage regulator module in an off state to avoid the regulator module to be in the on state for a long time, so that no transistor in the GOA circuit is in the on state for a long time, thus suppressing the threshold voltage drift of the transistor and improving reliability of the GOA circuit.

BRIEF DESCRIPTION OF DRAWINGS

To clear disclose the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF PREFERRED EMBODIMENTS

The following embodiments are described with reference to accompanying drawings to illustrate specific embodiments of the present invention. The directional terms in the present invention, such as up, down, front, back, left, right, inside, outside, side, and others are only directions with reference to the drawings. Thus, the directional terms are used for illustrating and understanding the present invention, and are not intended to limit the invention. In the drawings, similarly structured units are indicated by the same symbols.

The invention provides a GOA circuit and a driving method therefor and a display panel to solve the technical problems where a GOA circuit contains a plurality of transistors, and a threshold voltage of the transistor is prone to drift during a long time of transistor on state, that causes the transistor to malfunction, the GOA circuit output to fail, and display to work abnormally.

Figure 2:
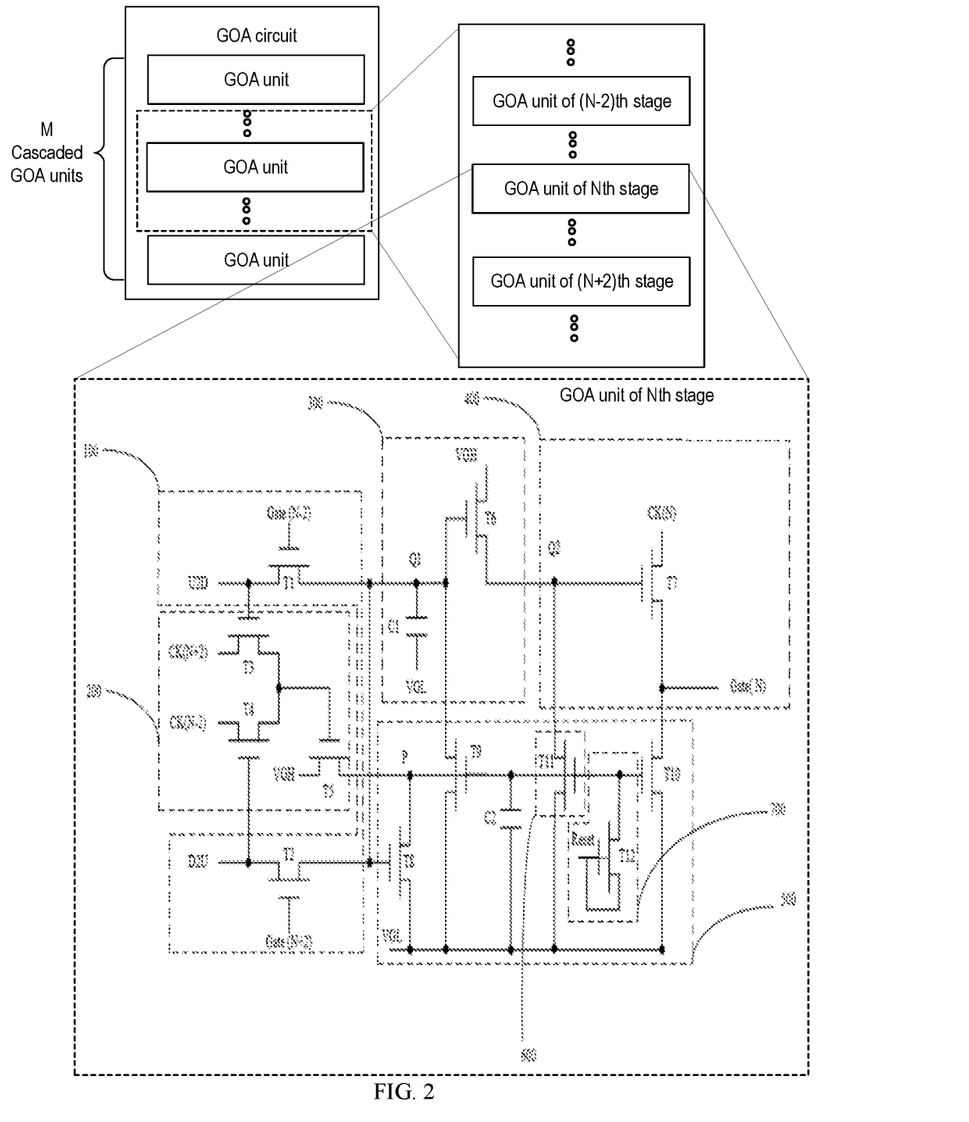
FIG. 2 is a schematic diagram showing a structural view of a GOA circuit provided by an embodiment of the present invention.

With reference to FIG. 2, the GOA circuit provided in this embodiment of the present invention includes M cascaded GOA units, of which a GOA unit of an Nth stage includes: a forward and reverse scan control module 100, a node signal control module 200, a voltage regulator module 300, an output control module 400, a first pull-down module 500, and a second pull-down module 600. N is a positive integer greater than two, M is a positive integer greater than or equal to N+2.

The forward and reverse scan control module 100 controls the GOA circuit to perform forward scan according to a forward scan control signal U2D or reverse scan according to a reverse scan control signal D2U.

The node signal control module 200 is connected to the forward and reverse scan control module 100, and configured to control the GOA circuit to output a low voltage level gate driving signal during a non-operating state according to a clock signal CK(N+2) of an (N+2)th stage and a clock signal CK(N−2) of an (N−2)th stage.

The voltage regulator module 300 is connected to the forward and reverse scan control module 100 through a first node Q1, and configured to maintain a voltage level of the first node Q1 under control of the forward and reverse scan control module 100.

The output control module 400 is connected to the voltage regulator module 300 through a second node Q2, and configured to control output of the gate driving signal Gate(N) of the instant stage according to the clock signal CK(N) of the instant stage.

The first pull-down module 500 is connected to the node signal control module 200 via a third node P, and configured to pull down a voltage level of the gate driving signal Gate(N) of the instant stage under control of the node signal control module 200.

The second pull-down module 600 is connected to the output control module 400 and the voltage regulator module 300 through the second node Q2, and configured to pull down a voltage level of the second node Q2. The forward and reverse scan control module 100 controls the voltage regulator module 300 to be in an off state when the second pull-down module 600 is in an operating state under control of the node signal control module 200, thereby suppressing the threshold voltage drift of the transistor and improving reliability of the GOA circuit.

Figure 3:
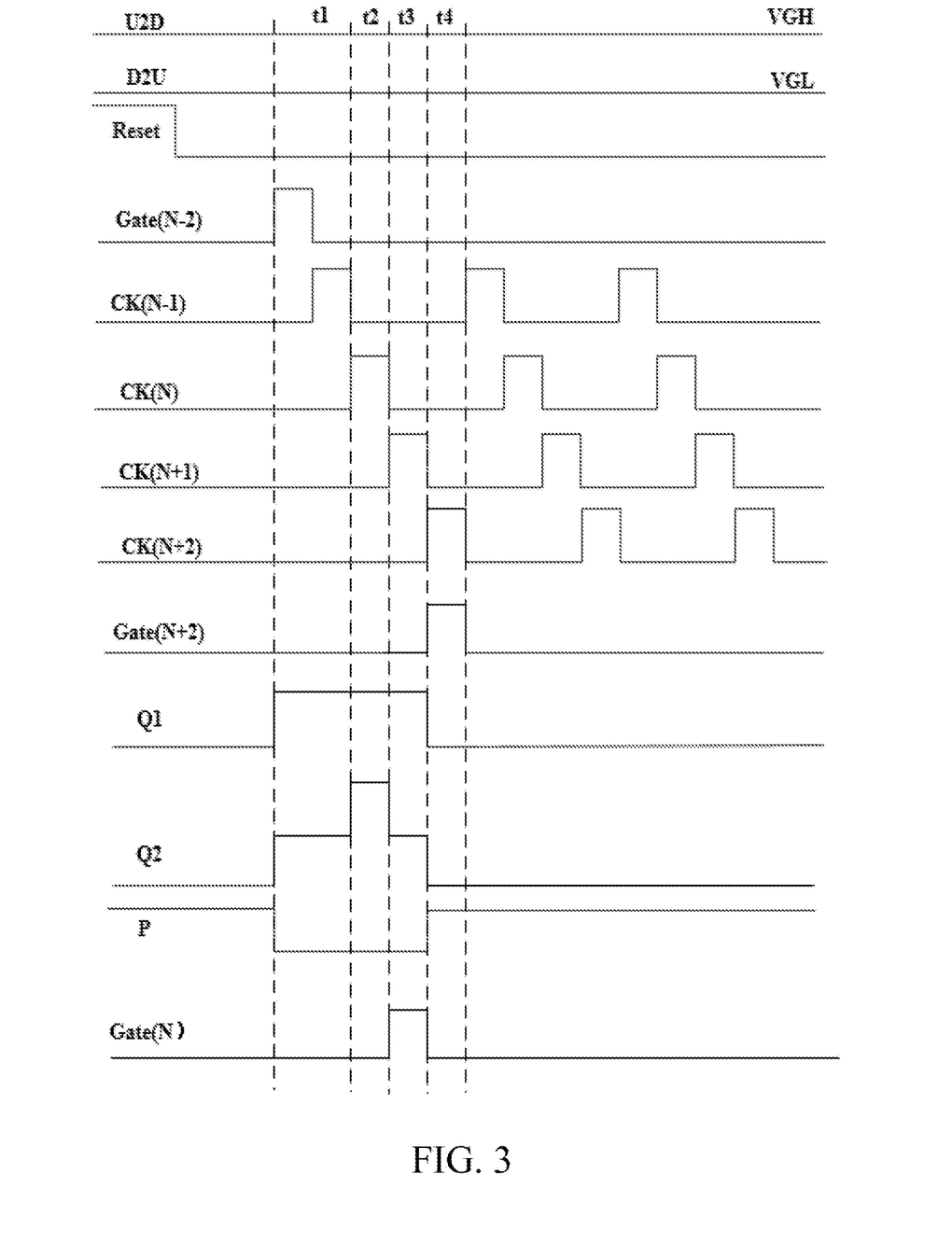
FIG. 3 is an operating timing diagram of a GOA circuit provided by an embodiment of the present invention.

In the present invention, with reference to FIGS. 2 and 3, the GOA circuit includes an input phase t1, an output phase t2, a first pull-down phase t3, and a second pull-down phase t4.

When the display panel is in a forward scan phase, the forward scan control signal U2D is in a high voltage level and the reverse scan control signal D2U is in a low voltage level, at which time the GOA circuit scans from top to bottom line by line. Conversely, when the display panel is in a reverse scan phase, the forward scan control signal U2D is in a low voltage level, and the reverse scan control signal D2U is in a high voltage level, at which time the GOA circuit scans from bottom to top line by line.

The forward and reverse scan control module 100 includes a first transistor T1 and a second transistor T2, a first electrode of the first transistor T1 is connected to the forward scan control signal U2D, a gate of the first transistor T1 is connected to a gate driving signal Gate(N−2) of the (N−2)th stage. A first electrode of the second transistor T2 is connected to the reverse scan control signal D2U, a gate of the second transistor T2 is connected to a gate driving signal Gate(N+2) of the (N+2)th stage, and a second electrode of the second transistor T2 is connected to a second electrode of the first transistor T1. The first transistor T1 is configured to cause the node signal control module 200, the voltage regulator module 300, and the output control module 400 to operate during the input phase t1, and to cause an output terminal of the output control module 400 be fed with the gate driving signal Gate(N) of the instant stage. The second transistor T2 is used to cause the first pull-down module 500 and the second pull-down module 600 to operate during the second pull-down phase t4.

The node signal control module 200 comprises a third transistor T3, a fourth transistor T4, and a fifth transistor T5. A first electrode of the third transistor T3 is connected to the clock signal CK(N+2) of the (N+2)th stage. A gate of the third transistor T3 is connected to the first electrode of the first transistor T1. A first electrode of the fourth transistor T4 is connected to the clock signal CK(N−2) of the (N−2)th stage. A gate of the fourth transistor T4 is connected to the first electrode of the second transistor T2. A first electrode of the fifth transistor T5 is connected to the high voltage level signal VGH, a second electrode of the fifth transistor T5 is connected to the first pull-down module 500 via the third node P, and a gate of the fifth transistor T5 is connected to the second electrode of the third transistor T3 and a second electrode of the fourth transistor T4.

The voltage regulator module 300 comprises a sixth transistor T6 and a first storage capacitor C1. A gate of the sixth transistor T6 is connected via the first node Q1 to the second electrode of the first transistor T1 and to a first pole plate of the first storage capacitor C1. A first electrode of the sixth transistor T6 is connected to the high voltage level signal VGH. A second pole plate of the first storage capacitor C1 is connected to the low voltage level signal VGL. The first storage capacitor C1 maintains the output control module 400 operating during the input phase t1, the output phase t2, and the first pull-down phase t3, and causes the output terminal of the output control module 400 be fed with the clock signal CK(N) of the instant stage.

The output control module 400 includes a seventh transistor T7. A first electrode of the seventh transistor T7 is connected to the clock signal CK(N) of the instant stage. A second electrode of the seventh transistor T7 is connected to the gate driving signal Gate(N) of the instant stage. A gate of the seventh transistor T7 is connected to the second electrode of the sixth transistor T6 via the second node Q2.

The first pull-down module 500 comprises an eighth transistor T8, a ninth transistor T9, a tenth transistor T10, and a second storage capacitor C2. A first electrode of the eighth transistor T8 is connected to the low voltage level signal VGL. A gate of the eighth transistor T8 is connected to the second electrode of the second transistor T2. A first electrode of the ninth transistor T9 is connected to the low voltage level signal VGL. A second electrode of the ninth transistor T9 is connected to the gate of the sixth transistor T6 and to the first pole plate of the first storage capacitor C1 via the first node Q1. A first electrode of the tenth transistor T10 is connected to the low voltage level signal VGL. A gate of the tenth transistor T10 is connected to the second electrode of the fifth transistor T5 via the third node P. A second electrode of the tenth transistor T10 is connected to the gate driving signal Gate(N) of the instant stage. A second pole plate of the second storage capacitor C2 is connected to the low voltage level signal VGL. The second storage capacitor C2 is used to maintain a voltage level of a gate of the ninth transistor T9 and a voltage level of a gate of the tenth transistor T10.

The second pull-down module 600 comprises an eleventh transistor T11. A gate of the eleventh transistor T11 is connected via the third node P to the second electrode of the fifth transistor T5, to the gate of the ninth transistor T9, and to a first pole plate of the second storage capacitor C2. A first electrode of the eleventh transistor T11 is connected to the low capacitance signal VGL. A second electrode of the eleventh transistor T11 is connected to the second electrode of the sixth transistor T6 and to the gate of the seventh transistor T7 via the second node Q2. With comparison to a current GOA circuit, the application provides the second pull-down module 600 or more specifically the eleventh transistor T11. Currently, due to the fact that the gate of the sixth transistor T6 in the voltage regulator module 300 in the related art is connected to the high voltage level signal VGH, so that the sixth transistor T6 is always on. In the present application, on the other hand, the gate of the sixth transistor T6 in the voltage regulator module 300 is connected to the first node Q1, and the first electrode of the sixth transistor T6 is connected to the high voltage level signal VGH. Thus, with provision of the eleventh transistor T11, when the sixth transistor T6 is switched off, a voltage level at the second node Q2 is connected to the low voltage level signal VGL, and the seventh transistor T7 in the output control module 400 is switched off.

The GOA circuit further comprises a reset module 700. The reset module 700 comprises a twelfth transistor T12. A gate of the twelfth transistor T12 and a first electrode of the twelfth transistor T12 are interconnected and both connected to a reset signal. A second electrode of the twelfth transistor T12 is connected to a gate of the tenth transistor T10 via the third node P.

Noted that the plurality of transistors located in the GOA circuit may be field effect transistors. Further, the plurality of transistors located in the GOA circuit may be thin film transistors (TFTs). Still further, the plurality of transistors located in the GOA circuit may be low temperature polycrystalline silicon (LTPS) thin film transistors. To distinguish between a source and a drain in the transistor other than a gate, a first electrode in the present invention may be one of a drain or a source. Accordingly, a second electrode is the other of a source or a drain.

With reference to FIGS. 2 and 3, embodiments of the present invention further provide a driving method of a GOA circuit for the GOA driving circuit, comprising the following steps:

In the input phase t1, the forward scan control signal U2D connected to the forward and reverse scan control module 100 in the GOA circuit operates the voltage regulator module 300 and the output control module 400, the node signal control module 200 keeps the first pull-down module 500 and the second pull-down module 600 in an off state, and the output control module 400 is fed with the gate driving signal Gate(N) for instant stage.

Specifically, in the input phase t1, when the gate driving signal of the (N−2)th stage is in a high voltage level, the first transistor T1 in the forward and reverse scan control module 100 conducts, a first electrode of the first transistor T1 is fed with the forward-scan control signal U2D and charges the first storage capacitor C1, and a voltage level of the first node Q1 is pulled up to a high level due to the first electrode of the sixth transistor T6 in the voltage regulator module 300 is fed with the high voltage level signal VGH, a voltage level of the second node Q2 also becomes high, the seventh transistor T7 in the output control module 400 conducts, and the output terminal of the output control module 400 is fed with the clock signal CK(N) of the instant stage. At the same time, the eighth transistor T8 in the first pull-down module 500 is on, the voltage level of the third node P is pulled down due to feeding of the low voltage level signal VGL to the first electrode of the eighth transistor T8. The ninth transistor T9 and tenth transistor T10 in the first pull-down module 500, and the eleventh transistor T11 in the second pull-down module 600 are switched off.

At a low voltage level of the gate driving signal Gate(N−2) of the (N−2)th stage, the first transistor T1 in the forward and reverse scan control module 100 is switched off, the signal stored in the first storage capacitor C1 maintains a high voltage level of the first node Q1, the sixth transistor T6 in the voltage regulator module 300 is on, a first electrode of the sixth transistor is fed with the high voltage level signal VGH, the voltage level of the second node Q2 is maintained high, the seventh transistor T7 in the output control module 400 is on, and the output terminal of the output control module 400 is fed with the clock signal CK(N) of the instant stage.

In output phase t2, the clock signal CK(N) of the instant stage causes a bootstrap effect in the output control module 400, the output control module 400 is fed with the gate driving signal Gate(N) of the instant stage, and the gate driving signal Gate(N) of the instant stage drives driver transistors in the pixel driving circuit.

Specifically, the seventh transistor T7 is kept on because the signal stored in the first storage capacitor C1 maintains the voltage levels at the first node Q1 and the second node Q2. Meanwhile, the ninth transistor T9 and the tenth transistor T10 in the first pull-down module 500, and the eleventh transistor T11 in the second pull-down module 600 continue to be fed with the low voltage level signal VGL, the ninth transistor T9, the tenth transistor T10, and the eleventh transistor T11 are switched off. The seventh transistor T7 is kept on so that when the clock signal CK(N) of the Nth stage is in a high voltage level, a bootstrap effect occurs at the gate of the seventh transistor T7 (i.e. at the second voltage point) and a voltage level at the second voltage point is pulled up to 2*VGH−VGL. The seventh transistor T7 is fully opened, at which time the output Gate(N) of the output control module 400 outputs full swing signals, and the output Gate(N) of the output control module 400 is fed with a high voltage level signal VGH loaded by the clock signal CK(N) of the Nth stage, thereby providing a gate driving signal for the driving transistors of the pixel driving circuit.

In the first pull-down phase t3, the output control module 400 is fed with the gate driving signal Gate(N) of the instant stage.

Specifically, the clock signal CK(N) of the Nth stage changes from a high voltage level to a low voltage level, the bootstrap effect at the gate of the seventh transistor T7 (i.e. at the second voltage point) disappears, the signal stored in the first storage capacitor C1 continues to maintain the voltage levels at the first node Q1 and the second node Q2, the seventh transistor T7 remains fully on, and the second transistor T2 in the node signal control module 200 is still kept on. The ninth transistor T9, the tenth transistor T10 and the eleventh transistor T11 are still switched off. The output Gate(N) of the output control module 400 is fed with the low voltage level signal VGL loaded by the clock signal CK(N) of the Nth stage, at which point the output Gate(N) of the output control module 400 is rapidly pulled down to a low voltage level.

In the second pull-down phase t4, the first pull-down module 500 and the second pull-down module 600 are in operation to pull down a voltage level of the gate driving signal Gate(N) of the instant stage. The forward and reverse scan control module 100 controls the voltage regulator module 300 in an off state, the output control module 400 in an off state, and the output terminal of the output control module 400 is fed with the low voltage level signal VGL.

Specifically, both the clock signal CK(N+2) of the (N+2)th stage and the gate driving signal Gate(N+2) of the (N+2)th stage transit from high to low, the second transistor T2 in the forward and reverse scan control module 100 and the fifth transistor T5 in the node signal control module 200 are turned on, the voltage level of the first node Q1 is pulled low, and the voltage level of the third node P is pulled high. Therefore, the ninth transistor T9 and the tenth transistor T10 in the first pull-down module 500, and the eleventh transistor T11 in the second pull-down module 600 are on, the voltage level at the first node Q1 and the second node Q2 are both pulled low, the sixth transistor T6 in the voltage regulator module 300 is switched off, the seventh transistor T7 in the output control module 400 is switched off, and the low voltage level signal VGL is fed to the output Gate(N) of the output control module 400, thus preventing the sixth transistor T6 from being in an on state. Meanwhile, the second storage capacitor C2 is charged, the ninth transistor T9, the tenth transistor T10, and the eleventh transistor T11 remain on in order to maintain output stability.

Further, the GOA circuit further comprises a reset module 700. Accordingly, the method of driving the GOA circuit further comprises a reset phase. The reset phase precedes the input phase t1. Before the start of a frame, the reset signal is a high voltage level signal VGH, the twelfth transistor T12 in the reset module 700 is turned on, and the voltage level at the third node P is pre-pulled up to a high voltage level, so that the first pull-down module and the second pull-down module are in operation. In particular, the ninth transistor T9 and the tenth transistor T10 in the first pull-down module 500, and the eleventh transistor T11 in the second pull-down module 600 are on, and the output Gate(N) of the output control module 400 is fed with the low voltage level signal VGL loaded with the clock signal CK(N) of the Nth stage. Subsequently, the reset signal changes from a high voltage level signal VGH to a low voltage level signal VGL, the twelfth transistor T12 in the reset module 700 is switched off, to wait arrival of the input phase t1.

The present invention also provides a display panel comprising any of the above GOA circuits, which may be a liquid crystal display panel.

The beneficial effect of the present invention is that the GOA circuit and the driving method therefor and display panel provided by the present invention improves reliability of the GOA circuit by adding a second pull-down module. The second pull-down module is connected to the output control module and the voltage regulator module through the second node that pulls down a voltage level of the second node. Under control of the node signal control module, when the second pull-down module is in an operating state, the forward and reverse scan control module controls the voltage regulator module in an off state to avoid the regulator module to be in the on state for a long time, so that no transistor in the GOA circuit is in the on state for a long time, thus suppressing the threshold voltage drift of the transistor and improving reliability of the GOA circuit.

In summary, although this application has disclosed the preferred embodiment as above, the preferred embodiments are not used to limit this application. Persons with ordinary skills in the art can do modification or improvement without departing from the spirit and scope of this application. Therefore, the scope of protection of this application is subject to the scope defined by the claims.

What is claimed is:

1. A gate driver on array (GOA) circuit comprising M cascaded GOA units, wherein N is a positive integer greater than two, M is a positive integer greater than or equal to N+2, an Nth stage GOA unit comprises:
   a forward and reverse scan control module configured to control the GOA circuit for forward scan according to a forward scan control signal or reverse scan according to a reverse scan control signal;
   a node signal control module connected to the forward and reverse scan control module, configured to control the GOA circuit to output a low voltage level gate driving signal during a non-operating state according to a (N+2)th stage clock signal and a (N−2)th stage clock signal;
   a voltage regulator module connected to the forward and reverse scan control module via a first node, configured to maintain a voltage level of the first node under control of the forward and reverse scan control module;
   an output control module connected to the voltage regulator module through a second node, configured to control output of a gate driving signal of an instant stage according to a clock signal of the instant stage;
   a first pull-down module connected to the node signal control module via a third node, configured to pull down a voltage level of the gate driving signal of the instant stage under control of the node signal control module; and
   a second pull-down module connected to the output control module and the voltage regulator module through the second node, configured to pull down a voltage level of the second node, with the forward and reverse scan control module controlling the voltage regulator module in an off state when the second pull-down module is in an operating state under control of the node signal control module;
   wherein the forward and reverse scan control module comprises a first transistor and a second transistor, a first electrode of the first transistor is connected to the forward scan control signal, a gate of the first transistor is connected to a (N−2)th stage gate driving signal, a first electrode of the second transistor is connected to the reverse scan control signal, a gate of the second transistor is connected to a (N+2)th stage gate driving signal, and a second electrode of the second transistor is connected to a second electrode of the first transistor;
   wherein the node signal control module comprises a third transistor, a fourth transistor, and a fifth transistor, a first electrode of the third transistor is connected to a level N+2 clock signal, a gate of the third transistor is connected to the first electrode of the first transistor, a first electrode of the fourth transistor is connected to a level N−2 clock signal, a gate of the fourth transistor is connected to the first electrode of the second transistor, a first electrode of the fifth transistor is connected to a high voltage level signal, a second electrode of the fifth transistor is connected to the first pull-down module through the third node, and a gate of the fifth transistor is connected to a second electrode of the third transistor and to a second electrode of the fourth transistor;
   wherein the voltage regulator module comprises a sixth transistor and a first storage capacitor, a gate of the sixth transistor is connected to the second electrode of the first transistor and to a first pole plate of the first storage capacitor through the first node, the first electrode of the sixth transistor is connected to the high voltage level signal, and the second pole plate of the first storage capacitor is connected to a low voltage level signal;
   wherein the output control module comprises a seventh transistor, a first electrode of the seventh transistor is connected to the clock signal of the instant stage, a second electrode of the seventh transistor is connected to the gate driving signal of the instant stage, a gate of the seventh transistor is connected to a second electrode of the sixth transistor through the second node;
   wherein the first pull-down module comprises an eighth transistor, a ninth transistor, a tenth transistor, and a second storage capacitor, wherein a first electrode of the eighth transistor is connected to the low voltage level signal, and a gate of the eighth transistor is connected to the second electrode of the second transistor, a first electrode of the ninth transistor is connected to the low voltage level signal, and a second electrode of the ninth transistor is connected via the first node to the gate of the sixth transistor and to the first pole plate of the first storage capacitor, a first electrode of the tenth transistor is connected to the low voltage level signal, a gate of the tenth transistor is connected via the third node to the second electrode of the fifth transistor, a second electrode of the tenth transistor is connected to the gate driving signal of the instant stage, and a second electrode of the second storage capacitor is connected to the low voltage level signal;

wherein the second pull-down module comprises an eleventh transistor, a gate of the eleventh transistor is connected via the third node to the second electrode of the fifth transistor, to a gate of the ninth transistor, and to a first pole plate of the second storage capacitor, a first electrode of the eleventh transistor is connected to the low voltage level signal, a second electrode of the eleventh transistor is connected via the second node to the second electrode of the sixth transistor and to the gate of the seventh transistor.

2. The GOA circuit according to claim 1, wherein the GOA circuit further comprises a reset module, the reset module comprises a twelfth transistor, a gate of the twelfth transistor and the first electrode of the twelfth transistor are interconnected and both connected to a reset signal, a second electrode of the twelfth transistor is connected to the gate of the tenth transistor via the third node.

3. The GOA circuit according to claim 1, wherein the plurality of transistors in the GOA circuit are low temperature polycrystalline silicon thin film transistors.

4. A display panel comprising a gate driver on array (GOA) circuit having M cascaded GOA units, wherein N is a positive integer greater than two, M is a positive integer greater than or equal to N+2, an Nth stage GOA unit comprises:

a forward and reverse scan control module configured to control the GOA circuit for forward scan according to a forward scan control signal or reverse scan according to a reverse scan control signal;

a node signal control module connected to the forward and reverse scan control module, configured to control the GOA circuit to output a low voltage level gate driving signal during a non-operating state according to a (N+2)th stage clock signal and a (N−2)th stage clock signal;

a voltage regulator module connected to the forward and reverse scan control module via a first node, configured to maintain a voltage level of the first node under control of the forward and reverse scan control module;

an output control module connected to the voltage regulator module through a second node, configured to control output of a gate driving signal of an instant stage according to a clock signal of the instant stage;

a first pull-down module connected to the node signal control module via a third node, configured to pull down a voltage level of the gate driving signal of the instant stage under control of the node signal control module; and a second pull-down module connected to the output control module and the voltage regulator module through the second node, configured to pull down a voltage level of the second node, with the forward and reverse scan control module controlling the voltage regulator module in an off state when the second pull-down module is in an operating state under control of the node signal control module;

wherein the forward and reverse scan control module comprises a first transistor and a second transistor, a first electrode of the first transistor is connected to the forward scan control signal, a gate of the first transistor is connected to a (N−2)th stage gate driving signal, a first electrode of the second transistor is connected to the reverse scan control signal, a gate of the second transistor is connected to a (N+2)th stage gate driving signal, and a second electrode of the second transistor is connected to a second electrode of the first transistor;

wherein the node signal control module comprises a third transistor, a fourth transistor, and a fifth transistor, a first electrode of the third transistor is connected to a level N+2 clock signal, a gate of the third transistor is connected to the first electrode of the first transistor, a first electrode of the fourth transistor is connected to a level N−2 clock signal, a gate of the fourth transistor is connected to the first electrode of the second transistor, a first electrode of the fifth transistor is connected to a high voltage level signal, a second electrode of the fifth transistor is connected to the first pull-down module through the third node, and a gate of the fifth transistor is connected to a second electrode of the third transistor and to a second electrode of the fourth transistor;

wherein the voltage regulator module comprises a sixth transistor and a first storage capacitor, a gate of the sixth transistor is connected to the second electrode of the first transistor and to a first pole plate of the first storage capacitor through the first node, the first electrode of the sixth transistor is connected to the high voltage level signal, and the second pole plate of the first storage capacitor is connected to a low voltage level signal;

wherein the output control module comprises a seventh transistor, a first electrode of the seventh transistor is connected to the clock signal of the instant stage, a second electrode of the seventh transistor is connected to the gate driving signal of the instant stage, a gate of the seventh transistor is connected to a second electrode of the sixth transistor through the second node;

wherein the first pull-down module comprises an eighth transistor, a ninth transistor, a tenth transistor, and a second storage capacitor, wherein a first electrode of the eighth transistor is connected to the low voltage level signal, and a gate of the eighth transistor is connected to the second electrode of the second transistor, a first electrode of the ninth transistor is connected to the low voltage level signal, and a second electrode of the ninth transistor is connected via the first node to the gate of the sixth transistor and to the first pole plate of the first storage capacitor, a first electrode of the tenth transistor is connected to the low voltage level signal, a gate of the tenth transistor is connected via the third node to the second electrode of the fifth transistor, a second electrode of the tenth transistor is connected to the gate driving signal of the instant stage, and a second electrode of the second storage capacitor is connected to the low voltage level signal;

wherein the second pull-down module comprises an eleventh transistor, a gate of the eleventh transistor is connected via the third node to the second electrode of the fifth transistor, to a gate of the ninth transistor, and to a first pole plate of the second storage capacitor, a first electrode of the eleventh transistor is connected to the low voltage level signal, a second electrode of the eleventh transistor is connected via the second node to the second electrode of the sixth transistor and to the gate of the seventh transistor.

5. The display panel according to claim 4, wherein the GOA circuit further comprises a reset module, the reset module comprises a twelfth transistor, a gate of the twelfth transistor and the first electrode of the twelfth transistor are interconnected and both connected to a reset signal, a second electrode of the twelfth transistor is connected to the gate of the tenth transistor via the third node.

6. The display panel according to claim 4, wherein the plurality of transistors in the GOA circuit are low temperature polycrystalline silicon thin film transistors.

7. A method for driving a gate driver on array (GOA) circuit having M cascaded GOA units, wherein N is a positive integer greater than two, M is a positive integer greater than or equal to N+2, the method comprising the steps of:

in an input phase, a forward scan control signal being connected to the forward and reverse scan control module in the GOA circuit and operating a voltage regulator module and an output control module, a node signal control module keeping a first pull-down module and a second pull-down module in an off state, and the output control module outputting gate driving signal of an instant stage;

in an output phase, a clock signal of the instant stage causing a bootstrap effect in the output control module, the output control module being fed with the gate driving signal of the instant stage to drive driver transistors in a pixel driving circuit;

in a first pull-down phase, the output control module being fed with the gate driving signal of the instant stage; and in a second pull-down phase, the first pull-down module and the second pull-down module being in operation, and pulling down a voltage level of the gate driving signal of the instant stage, the forward and reverse scan control module controlling the voltage regulator module in an off state, the output control module being in an off state, and an output terminal of the output control module being fed with a low voltage level signal;

wherein the forward and reverse scan control module comprises a first transistor and a second transistor, a first electrode of the first transistor is connected to the forward scan control signal, a gate of the first transistor is connected to a (N−2)th stage gate driving signal, a first electrode of the second transistor is connected to a reverse scan control signal, a gate of the second transistor is connected to a (N+2)th stage gate driving signal, and a second electrode of the second transistor is connected to a second electrode of the first transistor;

wherein the node signal control module comprises a third transistor, a fourth transistor, and a fifth transistor, a first electrode of the third transistor is connected to a level N+2 clock signal, a gate of the third transistor is connected to the first electrode of the first transistor, a first electrode of the fourth transistor is connected to a level N−2 clock signal, a gate of the fourth transistor is connected to the first electrode of the second transistor, a first electrode of the fifth transistor is connected to a high voltage level signal, a second electrode of the fifth transistor is connected to the first pull-down module through the third node, and a gate of the fifth transistor is connected to a second electrode of the third transistor and to a second electrode of the fourth transistor;

wherein the voltage regulator module comprises a sixth transistor and a first storage capacitor, a gate of the sixth transistor is connected to the second electrode of the first transistor and to a first pole plate of the first storage capacitor through the first node, the first electrode of the sixth transistor is connected to the high voltage level signal, and the second pole plate of the first storage capacitor is connected to a low voltage level signal;

wherein the output control module comprises a seventh transistor, a first electrode of the seventh transistor is connected to the clock signal of the instant stage, a second electrode of the seventh transistor is connected to the gate driving signal of the instant stage, a gate of the seventh transistor is connected to a second electrode of the sixth transistor through the second node;

wherein the first pull-down module comprises an eighth transistor, a ninth transistor, a tenth transistor, and a second storage capacitor, wherein a first electrode of the eighth transistor is connected to the low voltage level signal, and a gate of the eighth transistor is connected to the second electrode of the second transistor, a first electrode of the ninth transistor is connected to the low voltage level signal, and a second electrode of the ninth transistor is connected via the first node to the gate of the sixth transistor and to the first pole plate of the first storage capacitor, a first electrode of the tenth transistor is connected to the low voltage level signal, a gate of the tenth transistor is connected via the third node to the second electrode of the fifth transistor, a second electrode of the tenth transistor is connected to the gate driving signal of the instant stage, and a second electrode of the second storage capacitor is connected to the low voltage level signal;

wherein the second pull-down module comprises an eleventh transistor, a gate of the eleventh transistor is connected via the third node to the second electrode of the fifth transistor, to a gate of the ninth transistor, and to a first pole plate of the second storage capacitor, a first electrode of the eleventh transistor is connected to the low voltage level signal, a second electrode of the eleventh transistor is connected via the second node to the second electrode of the sixth transistor and to the gate of the seventh transistor.

8. The method for driving GOA circuit according to the claim 7, further comprising in a reset phase that precedes the input phase, the first pull-down module and the second pull-down module being in an operating state, and the output terminal of the output control module being fed with the low voltage level signal.

* * * * *